US006379824B1

(12) United States Patent
Hosokawa

(10) Patent No.: US 6,379,824 B1
(45) Date of Patent: Apr. 30, 2002

(54) ORGANIC ELECTROLUMINESCENCE DEVICE

(75) Inventor: Chishio Hosokawa, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 0 days.

(21) Appl. No.: 09/424,873

(22) PCT Filed: Aug. 4, 1999

(86) PCT No.: PCT/JP99/01874

§ 371 Date: Jan. 27, 2000

§ 102(e) Date: Jan. 27, 2000

(87) PCT Pub. No.: WO99/53727

PCT Pub. Date: Oct. 21, 1999

(30) Foreign Application Priority Data

Apr. 9, 1998 (JP) ............................................. 10-114324

(51) Int. Cl.$^7$ .............................................. H05B 11/14
(52) U.S. Cl. ....................... 428/690; 428/704; 428/917; 313/504; 313/506
(58) Field of Search ................................. 428/690, 917, 428/704; 313/504, 506

(56) References Cited

U.S. PATENT DOCUMENTS 5,281,489 A * 1/1994 Mori et al. ................. 428/690
6,069,442 A * 5/2000 Hung et al. ................. 312/504

* cited by examiner

*Primary Examiner*—Cynthia H. Kelly
*Assistant Examiner*—Ling Xu
(74) *Attorney, Agent, or Firm*—Oblon, Spivak, McClelland, Maier & Neustadt, P.C.

(57) ABSTRACT

The invention provides an organic EL device with improved luminous efficiency. The device has a structure comprising an inorganic non-degenerate semiconductor layer 12, an organic light-emitting layer 14 and a counter electrode 16 as formed in that order on a lower electrode 10, in which the inorganic non-degenerate semiconductor layer 12 is formed of an amorphous material of In—Zn—Al—O and its band gap energy is 2.9 eV.

7 Claims, 1 Drawing Sheet

ORGANIC ELECTROLUMINESCENCE DEVICE

TECHNICAL FIELD

The present invention relates to an organic electroluminescent device (hereinafter referred to as "an organic EL device"). More precisely, it relates to an organic EL device suitable to light sources for displays, printer heads and others for domestic and industrial use.

BACKGROUND OF THE INVENTION

Some conventional organic EL devices are disclosed in Reference 1 "Japanese Patent Laid-Open No. 312873/1989", Reference 2 "Japanese Patent Laid-Open No. 207488/1990", Reference 3 "Japanese Patent Laid-Open No. 41285/1993", and Reference 4 "Japanese Patent Laid-Open No. 119973/1994". The organic EL devices disclosed in those references have a laminate structure comprising an inorganic semiconductor layer that serves as a hole injection layer or an electron injection layer, and an organic light-emitting layer. In those, the inorganic semiconductor layer is degraded less than the organic layer. With the structure of that type, the organic EL devices could have a prolonged life.

In Reference 1, amorphous materials of III–V Group or II–V Group, for example, represented by $Si_{1-x}C_x$, or crystalline materials such as CuI, CuS, As, ZnTe and the like are used for the inorganic semiconductor layer.

In Reference 3 and Reference 4, disclosed are examples of using crystalline oxide semiconductor materials such as, typically $Cu_2O$ for the inorganic semiconductor layer.

However, in the organic EL devices disclosed in Reference 1 and Reference 2, the inorganic semiconductor layer of a crystalline material such as CuI or the like generally has a polycrystalline morphology. In those, the surface of the polycrystalline, inorganic semiconductor layer has poor planarity, having a surface roughness of the order of around 50 nm or more. In those, therefore, when a thin film of an organic light-emitting layer is formed on the polycrystalline, inorganic semiconductor layer, the projections of the rough surface of the inorganic semiconductor layer would often penetrate through the thin film. In that case, the inorganic semiconductor layer will short-circuit with the electrode on the organic light-emitting layer to give a leak current. Even if they do not short-circuit with each other, the projections of the rough surface of the inorganic semiconductor layer will yield the concentration of electric field around them, thereby also giving a leak current. For these reasons, the conventional organic EL devices have the problem of the low luminous efficiency depression.

In forming the inorganic semiconductor layer, it is heated at a temperature higher than the temperature at which the organic light-emitting layer is stable and safe. Therefore, the light-emitting layer shall be formed after the inorganic semiconductor layer has been formed.

In addition, in the organic EL devices disclosed in Reference 1 and Reference 2, the energy gap of the amorphous materials of $Si_{1-x}C_x$ used is smaller than 2.6 eV. On the contrary, the energy gap of the organic light-emitting layer that contains a light-emitting material of aluminium complexes or stilbene derivatives is larger than 2.6 eV. As a result, the excited state having been produced in the organic light-emitting layer is often quenched through energy transfer from the organic light-emitting layer to the inorganic semiconductor layer. Accordingly, the organic EL devices have the problem of the low luminous efficiency.

What is more, where amorphous silicon materials (e.g., α-Si, α-SiC) are used for the inorganic semiconductor layer in those organic EL devices, the local level attributed to the dangling bonds in the energy band gap will be on the order of at least $10^{17}$ cm$^{-3}$. In that condition, even if the band gap energy is large, the excited state will be quenched owing to the local level. Accordingly, the organic EL devices have the problem of the low luminous efficiency.

On the other hand, oxide conductors such as $Cu_2O$ and others used in Reference 3 and Reference 4 are crystalline substances. In those, the oxide conductors such as $Cu_2O$ and others are baked at high temperatures and, therefore, generally have a polycrystalline morphology. Accordingly, for the same reasons as in the case of Reference 1 and Reference 2 noted above, the organic EL devices in Reference 3 and Reference 4 also have the problem of the low luminous efficiency in that the rough surface of the polycrystalline, inorganic semiconductor layer in those organic EL devices produces a leak current.

Taking account of the problems noted above, we, the present inventors have achieved the invention. The object of the invention is to provide an organic EL device with high luminous efficiency.

DISCLOSURE OF THE INVENTION

To attain the object, the organic EL device of the invention has a structure of a first electrode layer, an inorganic non-degenerate semiconductor layer, at least one organic layer including a light-emitting layer, and a second electrode layer as laminated in that order, and is characterized in that;

the inorganic non-degenerate semiconductor layer includes an amorphous material or a microcrystalline material, and its band gap energy is higher than that of the organic light-emitting layer.

In the organic EL device of the invention, the inorganic non-degenerate semiconductor layer includes an amorphous material or a microcrystalline material. Accordingly, in this, the surface of the inorganic non-degenerate semiconductor layer is planarized. As a result, in this, the inorganic non-degenerate semiconductor layer with no surface roughness is prevented from producing a leak current. Accordingly, the luminous efficiency of the organic EL device with that structure is improved.

In the organic EL device of the invention, the band gap energy of the inorganic non-degenerate semiconductor layer is higher than that of the organic light-emitting layer. As a result, in the organic EL device, the excited state-having been produced in the organic light-emitting layer is prevented from being quenched through energy transfer from the organic light-emitting layer to the inorganic non-degenerate semiconductor layer. Accordingly, the luminous efficiency of the organic EL device with that structure is improved.

In the organic EL device of the invention, the band gap energy of the inorganic non-degenerate semiconductor layer preferably falls between 2.7 eV and 6 eV.

As so mentioned hereinabove, the energy gap of the organic light-emitting layer including a light-emitting material of aluminium complexes or stilbene derivatives is larger than 2.6 eV. Therefore, in the organic EL device of the invention in which the band gap energy of the inorganic non-degenerate semiconductor layer is at least 2.7 eV, the excited state of the organic light-emitting layer is prevented from being quenched.

Also preferably, in the organic EL device of the invention, the inorganic non-degenerate semiconductor layer is for hole conduction. Specifically, in this, the inorganic non-degenerate semiconductor layer may function as a hole injection layer.

Also preferably, in the organic EL device of the invention, the inorganic non-degenerate semiconductor layer is for electron conduction. Specifically, in this, the inorganic non-degenerate semiconductor layer may function as an electron injection layer.

In carrying out the invention, it is also preferable that the inorganic non-degenerate semiconductor layer in the organic EL device comprises, as the main component, an oxide or oxynitride of at least one element of Ba (barium), Ca (calcium), Sr (strontium), Yb (ytterbium), Al (aluminium), Ga (gallium), In (indium), Li (lithium), Na (sodium), Cd (cadmium), Mg (magnesium), Si (silicon), Ta (tantalum), Sb (antimony) and Zn (zinc).

In carrying out the invention, it is more preferable that the inorganic non-degenerate semiconductor layer in the organic EL device is of an oxide or oxynitride of an element combination of any of a combination of In and Zn, a combination of In, Zn and Al, a combination of Al, Zn and Si, a combination of In, Zn and Yb, a combination of In, Zn and Ta or the like.

In the invention, it is also preferable that the carrier concentration in the inorganic non-degenerate semiconductor layer falls between $10^{19}$ cm$^{-3}$ and $10^{12}$ cm$^{-3}$.

In the organic EL device in which the carrier concentration in the inorganic non-degenerate semiconductor layer is so reduced as to fall within the defined range, the possibility of interaction between the inorganic semiconductor and the excited states of the organic light-emitting layer is reduced. As a result, the luminous efficiency of the organic EL device is prevented from being lowered.

In the invention, it is still desirable that the local level density in the inorganic non-degenerate semiconductor layer is smaller than $10^{17}$ cm$^{-3}$.

In the organic EL device in which the local level, density in the inorganic non-degenerate semiconductor layer is smaller than $10^{17}$ cm$^-$, the local level of that order does not cause inactivation of the excited state of the organic light-emitting layer.

In the invention, it is further desirable that the inorganic non-degenerate semiconductor layer is of an oxide of essentially In.

BRIEF DESCRIPTION OF THE DRAWING

In FIG. 1, a reference numeral 10 indicates a lower electrode for a first electrode layer; a reference numeral 12 indicates an inorganic non-degenerate semiconductor layer; a reference numeral 14 indicates an organic light-emitting layer; a reference numeral 16 indicates a counter electrode for a second electrode layer; and a reference numeral 100 indicates an organic EL device.

BEST MODES FOR CARRYING OUT THE INVENTION

Figure 1:
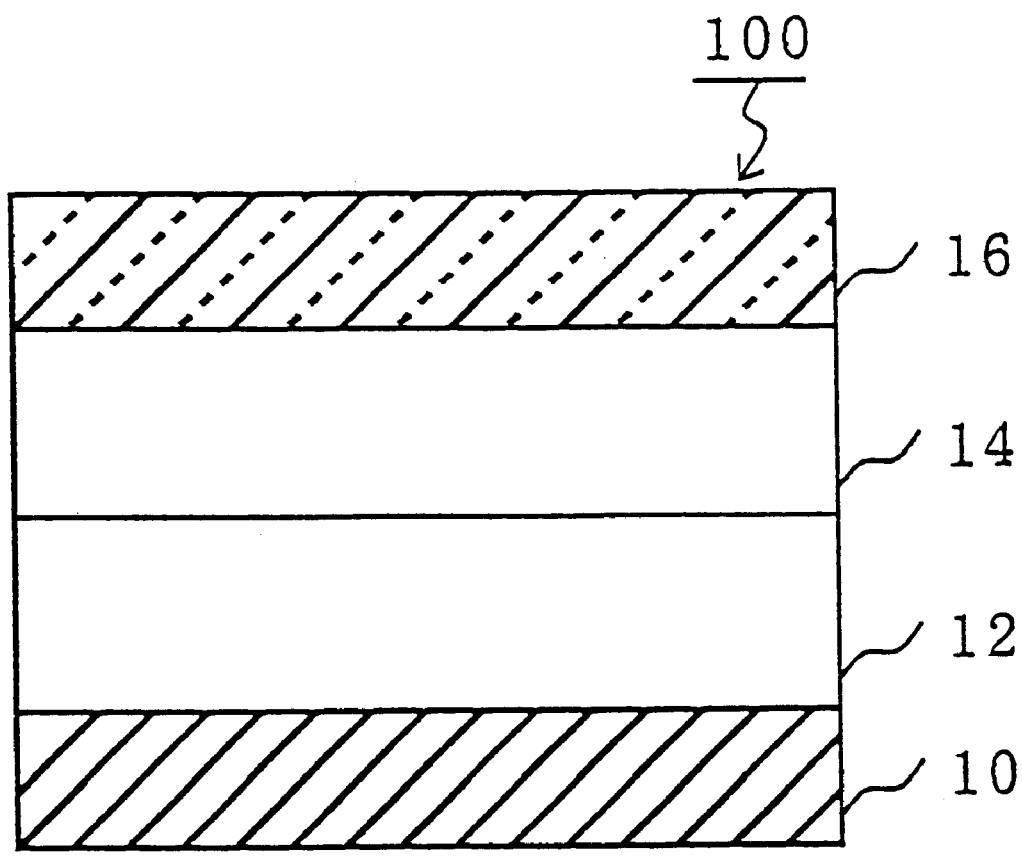
FIG. 1 is a cross-sectional view for one embodiment of the organic EL device of the invention.

Embodiments of the invention are described hereinunder, with reference to the drawing. In the reference drawing, the size, the shape and the configuration of the constituent components are graphically shown to such a degree that the invention is easy to understand from them. Therefore, the invention is not limited to the illustrated case. In the drawing, the hatching to show the cross section is partly omitted.

First referred to is FIG. 1. This shows the structure of an organic EL device 100, which is one embodiment of the invention. The organic EL device 100 is so constructed that a lower electrode 10 for a first electrode layer, an inorganic non-degenerate semiconductor layer 12, an organic light-emitting layer 14, and a counter electrode 16 for a second electrode layer are laminated in that order.

In this, the inorganic non-degenerate semiconductor layer 12 includes an amorphous material or a microcrystalline material. The surface of the inorganic non-degenerate semiconductor layer of such an amorphous or microcrystalline material can be planarized. As a result, the inorganic non-degenerate semiconductor layer with no surface roughness is prevented from producing a leak current. Accordingly, the luminous efficiency of the organic EL device with that structure is improved.

The condition of the inorganic semiconductor (for example, the amorphous or microcrystalline condition thereof) can be identified, for example, through X-ray analysis.

In addition, in the organic EL device illustrated, the band gap energy of the inorganic non-degenerate semiconductor layer 12 is higher than that of the organic light-emitting layer. Concretely, it is preferable that the band gap energy of the inorganic non-degenerate semiconductor layer 12 falls between 2.7 eV and 6 eV.

In the organic EL device where the band gap energy of the inorganic non-degenerate semiconductor layer is large, the excited state having been produced in the organic light-emitting layer 14 is prevented from being quenched by the energy transfer from the organic light-emitting layer to the inorganic non-degenerate semiconductor layer 12. Accordingly, the luminous efficiency of the organic EL device with that structure is improved.

The band gap energy can be obtained, for example, by reading the wavelength at the absorption edge in the transmission spectrum of the layer.

In the organic EL device, the inorganic non-degenerate semiconductor layer 12 may be for hole conduction so that it may function as a hole injection layer. In this case, the lower electrode 10 is an anode and the counter electrode 16 is a cathode.

Alternatively, in this, the inorganic non-degenerate semiconductor layer 12 may be for electron conduction so that it may function as an electron injection layer. In this case, the lower electrode 10 is a cathode and the counter electrode 16 is an anode.

In carrying out the invention, it is preferable that the inorganic non-degenerate semiconductor layer 12 in the organic EL device comprises, as the main component, an oxide or oxynitride of, for example, at least one element of Yb (ytterbium), Al (aluminium), Ga (gallium), In (indium), Zn (zinc), Cd (cadmium), Mg (magnesium), Si (silicon), Ta (tantalum) and Sb (antimony).

Concretely, it is preferable that the oxide or oxynitride is of an element combination of any of a combination of In and Zn, a combination of Al, Zn and Sb, a combination of In, Zn and Yb, of a combination of In, Zn and Ta.

In this embodiment illustrated, the carrier concentration in the inorganic non-degenerate semiconductor layer 12 falls between $10^{19}$ cm$^{-3}$ and $10^{12}$ cm$^{-3}$.

With the carrier concentration in the semiconductor layer therein being reduced so, the luminous efficiency of the organic EL device is prevented from being lowered.

As opposed to this, if the inorganic semiconductor for the layer has a high carrier concentration, for example, the layer is of a non-degenerate semiconductor having a carrier concentration of higher than $10^{19}$ cm$^{-3}$, the carriers in the layer will interact with the excited state having been produced in the organic light-emitting layer whereby the luminous efficiency of the organic EL device will be lowered.

The carrier concentration can be measured, for example, by using the hole effect of the layer.

In this embodiment illustrated, the local level density in the inorganic non-degenerate semiconductor layer 12 is made smaller than $10^{17}$ cm$^{-3}$. With its density being smaller than $10^{17}$ cm$^{-3}$, the local level in the semiconductor layer cause quenching of the excited state of the organic light-emitting layer.

The local level density can be obtained from the data of current-voltage-capacitance of the inorganic non-degenerate semiconductor for the layer.

In the organic EL device of the invention, it is preferable that the organic light-emitting layer is for hole conduction.

Example 1 of the invention is described below.

EXAMPLE 1

In the organic EL device of Example 1, the lower electrode is a transparent electrode.

To fabricate the organic EL device of Example 1, first formed was an ITO film having a thickness of 100 nm on a glass substrate having a thickness of 1 mm and an area size of 25 mm×75 mm. The combination of the glass substrate and the ITO film serves as the substrate herein. Next, the substrate was ultrasonically washed with isopropyl alcohol. Then, the substrate was dried in an N$_2$ (nitrogen gas) atmosphere, and washed with a combination of UV (ultraviolet rays) and ozone for 30 minutes. In Example 1, the lower electrode thus formed serves as an anode.

Next, the substrate was set in a chamber of a vapor deposition-sputtering device from Nippon Vacuum Co. In this, an inorganic non-degenerate semiconductor layer was formed on the ITO film through sputtering (ICNS). For the sputtering, sintered InZnO and Al$_2$O$_3$ were the targets. For these, the atomic ratio of In to In, Zn and Al was 0.6 as one example. The atomic ratio of Al to In, Zn and Al was 0.1 as one example.

During the sputtering, a mixed gas of argon gas/oxygen gas (2.0/1 by volume) was introduced into the chamber. The sputtering conditions were as follows: The vacuum degree in the chamber was 3×10$^{-4}$ Pa, the output power was 50 W, the RF frequency was 13.56 MHz, and the cathode voltage was 400 V.

In Example 1, the inorganic non-degenerate semiconductor layer formed through vapor deposition was of an oxide of In—Zn—Al—O, having a thickness of 200 nm. The oxide has hole conductivity and is transparent.

Next, on the inorganic non-degenerate semiconductor layer, formed was an organic light-emitting layer of 8-hydroxyquinoline/Al complex (Al complex), which is an electron-transporting organic compound, through vacuum evaporation. The thickness of the layer was 60 nm.

On the organic light-emitting layer, formed was a counter electrode of Al:Li alloy through vacuum evaporation. The thickness of the layer was 200 nm. In Example 1, the counter electrode serves as a cathode.

Through the process as above, fabricated was an organic EL device of Example 1.

The band gap energy of the inorganic non-degenerate semiconductor layer in the organic EL device of Example 1 was 2.9 eV, as in Table 1 below. To measure the band gap energy of the inorganic non-degenerate semiconductor layer, the oxide constituting the layer was subjected to transmission spectrometry, and the energy corresponding to the wavelength of the absorption end was read in the transmission spectrum of the oxide layer.

The specific resistance of the inorganic non-degenerate semiconductor layer was measured, and was 1×10 Ω·cm. The inorganic non-degenerate semiconductor layer was subjected to X-ray diffractiometry, through which the layer was found amorphous.

A constant voltage of 6 V was applied between the lower electrode and the counter electrode to drive the device at the constant voltage. In that condition, the device gave an initial luminance of 100 cd/m$^2$, and its luminous efficiency was 1.2 m/W.

On the other hand, the device driven at a constant voltage of 7.5 V gave an initial luminance of 170 cd/m$^2$, and its half lifetime was 750 hours. The half lifetime as referred to herein is meant to indicate the time taken by the device before its initial luminance is reduced to a half thereof.

EXAMPLE 2

Example 2 of the invention is described. The structure of the organic EL device of Example 2 is the same as that of the device of Example 1. In Example 2, however, an oxide layer of In—Zn—Si—O serving as the inorganic non-degenerate semiconductor layer was formed through sputtering. The oxide has hole conductivity and is transparent.

For the sputtering, the atomic ratio of In to In, Zn and Si was controlled to fall between 0.57 and 0.6, and the atomic ratio of Si to In, Zn and Si was to fall between 0.1 and 0.23. The other conditions for the sputtering were the same as those in Example 1.

The band gap energy of the inorganic non-degenerate semiconductor layer in the device of Example 2 was 2.9 eV, as in Table 1 below. The specific resistance of the layer was 1×10$^2$ Ω·cm. Regarding its morphology, the inorganic non-degenerate semiconductor layer was found amorphous.

A constant voltage of 7.5 V was applied to the device, and the luminous efficiency of the device driven in that condition was 1.21 m/W. The half lifetime of the device was 800 hours.

EXAMPLE 3

Example 3 of the invention is described. The structure of the organic EL device of Example 3 is the same as that of the device of Example 1. In Example 3, however, an oxide layer of In—Zn—Mg—O serving as the inorganic non-degenerate semiconductor layer was formed through sputtering. The oxide has hole conductivity and is transparent.

For the sputtering, the atomic ratio of In to In, Zn and Mg was controlled to fall between 0.57 and 0.6, and the atomic ratio of Mg to In, Zn and Mg was to fall between 0.1 and 0.23. The other conditions for the sputtering were the same as those in Example 1.

The band gap energy of the inorganic non-degenerate semiconductor layer in the device of Example 3 was 3.0 eV, as in Table 1 below. The specific resistance of the layer was 2×10 Ω·cm. Regarding its morphology, the inorganic non-degenerate semiconductor layer was found microcrystalline.

A constant voltage of 7.5 V was applied to the device, and the luminous efficiency of the device driven in that condition was 1.51 m/W. The half lifetime of the device was 1200 hours.

EXAMPLE 4

Example 4 of the invention is described. The structure of the organic EL device of Example 4 is the same as that of the device of Example 1. In Example 4, however, an oxide layer of In—Zn—Yb—O serving as the inorganic non-degenerate semiconductor layer was formed through sputtering. The oxide has hole conductivity and is transparent.

For the sputtering, the atomic ratio of In to In, Zn and Yb was controlled to fall between 0.57 and 0.6, and the atomic ratio of Yb to In, Zn and Yb was to fall between 0.1 and 0.23. The other conditions for the sputtering were the same as those in Example 1.

The band gap energy of the inorganic non-degenerate semiconductor layer in the device of Example 4 was 3.1 eV, as in Table 1 below. The specific resistance of the layer was $3 \times 10^{-1}$ Ω·cm. Regarding its morphology, the inorganic non-degenerate semiconductor layer was found amorphous.

A constant voltage of 7.5 V was applied to the device, and the luminous efficiency of the device driven in that condition was 1.01 m/W. The half lifetime of the device was 650 hours.

EXAMPLE 5

Example 5 of the invention is described. The structure of the organic EL device of Example 5 is the same as that of the device of Example 1. In Example 5, however, an oxide layer of In—Ga—Si—O serving as the inorganic non-degenerate semiconductor layer was formed through sputtering. The oxide has hole conductivity and is transparent.

At For the sputtering, the atomic ratio of In to In, Ga and Si was controlled to fall between 0.57 and 0.6, and the atomic ratio of Si to In, Ga and Si was to fall between 0.1 and 0.23. The other conditions for the sputtering were the same as those in Example 1.

The band gap energy of the inorganic non-degenerate semiconductor layer in the device of Example 5 was 3.0 eV, as in Table 1 below. The specific resistance of the layer was $3 \times 10^{-2}$ Ω·cm. Regarding its morphology, the inorganic non-degenerate semiconductor layer was found microcrystalline.

A constant voltage of 7.5 V was applied to the device, and the luminous efficiency of the device driven in that condition was 0.91 m/W. The half lifetime of the device was 700 hours.

EXAMPLE 6

Example 6 of the invention is described. The structure of the organic EL device of Example 6 is the same as that of the device of Example 1. In Example 6, however, an oxide layer of In—Ga—Al—O serving as the inorganic non-degenerate semiconductor layer was formed through sputtering. The oxide has hole conductivity and is transparent.

For the sputtering, the atomic ratio of In to In, Ga and Al was controlled to fall between 0.57 and 0.6, and the atomic ratio of Al to In, Ga and Al was to fall between 0.1 and 0.23. The other conditions for the sputtering were the same as those in Example 1.

The band gap energy of the inorganic non-degenerate semiconductor layer in the device of Example 6 was 2.9 eV, as in Table 1 below. The specific resistance of the layer was $1 \times 10$ Ω·cm. Regarding its morphology, the inorganic non-degenerate semiconductor layer was found microcrystalline.

A constant voltage of 7.5 V was applied to the device, and the luminous efficiency of the device driven in that condition was 1.31 m/W. The half lifetime of the device was 720 hours.

EXAMPLE 7

Example 4 of the invention is described. The structure of the organic EL device of Example 2 is the same as that of the device of Example 1. In Example 2, however, an oxide layer of In—Zn—Ta—O serving as the inorganic non-degenerate semiconductor layer was formed through sputtering. The oxide has hole conductivity and is transparent.

For the sputtering, the atomic ratio of In to In, Zn and Ta was controlled to fall between 0.57 and 0.6, and the atomic ratio of Ta to In, Zn and Ta was to fall between 0.1 and 0.23. The other conditions for the sputtering were the same as those in Example 1.

The band gap energy of the inorganic non-degenerate semiconductor layer in the device of Example 7 was 22.8 eV, as in Table 1 below. The specific resistance of the layer was $7 \times 10$ Ω·cm. Regarding its morphology, the inorganic non-degenerate semiconductor layer was found amorphous.

A constant voltage of 7.5 V was applied to the device, and the luminous efficiency of the device driven in that condition was 1.21 m/W. The half lifetime of the device was 450 hours.

EXAMPLE 8

Example 8 of the invention is described. The structure of the organic EL device of Example 8 is the same as that of the device of Example 1. In Example 8, however, an oxide layer of In—Zn—Si—O—N serving as the inorganic non-degenerate semiconductor layer was formed through sputtering. The oxide has hole conductivity and is transparent.

The band gap energy of the inorganic non-degenerate semiconductor layer in the device of Example 8 was 3.1 eV, as in Table 1 below. The specific resistance of the layer was $7 \times 10^3$ Ω·cm. Regarding its morphology, the inorganic non-degenerate semiconductor layer was found amorphous.

A constant voltage of 7.5 V was applied to the device, and the luminous efficiency of the device driven in that condition was 1.41 m/W. The half lifetime of the device was 2000 hours.

EXAMPLE 9

Example 9 of the invention is described. The structure of the organic EL device of Example 9 is the same as that of the device of Example 1. In Example 9, however, an oxide layer of In—Zn—Al—O—N serving as the inorganic non-degenerate semiconductor layer was formed through sputtering. The oxide has hole conductivity and is transparent.

The band gap energy of the inorganic non-degenerate semiconductor layer in the device of Example 9 was 3.1 eV, as in Table 1 below. The specific resistance of the layer was $8 \times 10^2$ Ω·cm. Regarding its morphology, the inorganic non-degenerate semiconductor layer was found amorphous.

A constant voltage of 7.5 V was applied to the device, and the luminous efficiency of the device driven in that condition was 1.61 m/W. The half lifetime of the device was 1500 hours.

EXAMPLE 10

Example 10 of the invention is described. The structure of the organic EL device of Example 10 is the same as that of the device of Example 1. In Example 10, however, the counter electrode was of Al but not Al:Li. Al has a work function of at least 4.0 eV, and is highly durable.

In addition, in Example 10, an oxide layer of In—Zn—Ba—O serving as the inorganic non-degenerate semiconductor layer was formed through sputtering. The oxide has hole conductivity and is transparent.

For the sputtering, the atomic ratio of In to In, Zn and Ba was controlled to fall between 0.57 and 0.6, and the atomic ratio of Ba to In, Zn and Ba was to fall between 0.1 and 0.23. The output power for the sputtering was 20 W. The other conditions for the sputtering were the same as those in Example 1.

The band gap energy of the inorganic non-degenerate semiconductor layer in the device of Example 10 was 3.0 eV, as in Table 1 below. The specific resistance of the layer was $4 \times 10^{-2}$ Ω·cm. Regarding its morphology, the inorganic non-degenerate semiconductor layer was found amorphous.

A constant voltage of 7.5 V was applied to the device, and the luminous efficiency of the device driven in that condition was 2.11 m/W. The half lifetime of the device was 3200 hours.

EXAMPLE 11

Example 11 of the invention is described. The structure of the organic EL device of Example 11 is the same as that of the device of Example 10. In Example 11, however, an oxide layer of In—Zn—Sr—O serving as the inorganic non-degenerate semiconductor layer was formed through sputtering. The oxide has hole conductivity and is transparent.

For the sputtering, the atomic ratio of In to In, Zn and Sr was controlled to fall between 0.57 and 0.6, and the atomic ratio of Sr to In, Zn and Sr was to fall between 0.1 and 0.23. The other conditions for the sputtering were the same as those in Example 1.

The band gap energy of the inorganic non-degenerate semiconductor layer in the device of Example 11 was 2.8 eV, as in Table 1 below. The specific resistance of the layer was $3 \times 10^{-2}$ Ω·cm. Regarding its morphology, the inorganic non-degenerate semiconductor layer was found amorphous.

A constant voltage of 7.5 V was applied to the device, and the luminous efficiency of the device driven in that condition was 2.41 m/W. The half lifetime of the device was 4000 hours.

EXAMPLE 12

Example 12 of the invention is described. The structure of the organic EL device of Example 12 is the same as that of the device of Example 1. In Example 12, however, PAVBi of the following formula (1) was used for the organic light-emitting layer. PAVBi has hole transporting ability.

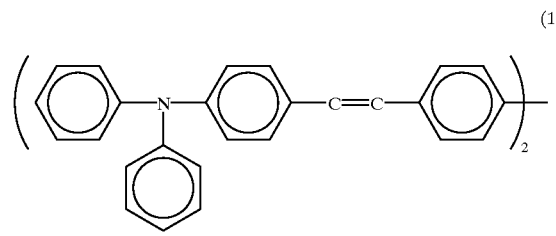

(1)

A constant voltage of 7.5 V was applied to the device. The device driven at the constant voltage gave an initial luminance of 210 cd/m², and its luminous efficiency was 2.31 m/W. The half lifetime of the device was 1300 hours. The device emits bluish green light.

Some examples comprising a combination of an organic light-emitting layer of PAVBi and an electron injection layer of an oxadiazole derivative are known. Having the combination, the luminous efficiency of the known devices is high, but the life thereof lasts 50 hours and is extremely short.

REFERENCE EXAMPLE

Reference Example for the invention is described. The structure of the organic EL device of Reference Example is the same as that of the device of Example 12. Being different from that of Example 12, however, the device of Reference Example does not have the inorganic non-degenerate semiconductor layer of In—Zn—Si—O.

A constant voltage of 5 V was applied to the device. The device driven at the constant voltage gave an initial luminance of 180 cd/m², and its luminous efficiency was 2.01 m/W. The half lifetime of the device was 800 hours.

COMPARATIVE EXAMPLE 1

Comparative Example 1 is described. The structure of the organic EL device of Comparative Example 1 is the same as that of the device of Example 1. In the device of Comparative Example 1, however, TPD of the following formula (2),

TABLE 1

| Example | Oxide | Specific Resistance (Ω · cm) | Energy Gap (eV) | Morphology | Efficiency (lm/W) | Half Lifetime (hrs) |
|---|---|---|---|---|---|---|
| 1 | In—Zn—Al—O | $1 \times 10$ | 2.9 | amorphous | 1.2 | 750 |
| 2 | In—Zn—Si—O | $1 \times 10^2$ | 2.9 | amorphous | 1.2 | 800 |
| 3 | In—Zn—Mg—O | $2 \times 10$ | 3.0 | micro-crystalline | 1.5 | 1200 |
| 4 | In—Zn—Yb—O | $3 \times 10^{-1}$ | 3.1 | amorphous | 1.0 | 650 |
| 5 | In—Ga—Si—O | $3 \times 10^{-2}$ | 3.0 | micro-crystalline | 0.9 | 700 |
| 6 | In—Ga—Al—O | $1 \times 10$ | 2.9 | micro-crystalline | 1.3 | 720 |
| 7 | In—Zn—Ta—O | $7 \times 10$ | 2.8 | amorphous | 1.2 | 450 |
| 8 | In—Zn—Si—O—N | $7 \times 10^3$ | 3.1 | amorphous | 1.4 | 2000 |
| 9 | In—Zn—Al—O—N | $3 \times 10^3$ | 3.1 | amorphous | 1.6 | 1500 |
| 10 | In—Zn—Ba—O | $4 \times 10^{-2}$ | 3.0 | amorphous | 2.1 | 3200 |
| 11 | In—Zn—Sr—O | $3 \times 10^{-1}$ | 2.8 | amorphous | 2.4 | 4000 | which is an organic hole injection material, was used in place of the inorganic non-degenerate semiconductor layer.

(2)

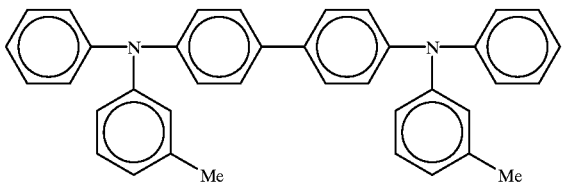

A constant voltage of 6.5 V was applied to the device. The device driven at the constant voltage gave an initial luminance of 130 cd/m$^2$, but its half lifetime was only 120 hours.

COMPARATIVE EXAMPLE 2

Comparative Example 2 is described. The structure of the organic EL device of Comparative Example 2 is the same as that of the device of Example 1. In Comparative Example 1, however, a hole-conductive microcrystalline Si (P-$\mu$C-Si) layer serving as the inorganic non-degenerate semiconductor layer was formed through plasma CVD. Its thickness was 30 nm.

In forming the layer, used was a plasma CVD apparatus, in which the RF output power was 800 W, the substrate temperature was 300° C., and the pressure was 20 mTorr. A mixed gas of SiH4/H2B2H6 (6000 ppm) was introduced into the chamber of the apparatus.

The band gap energy of the inorganic non-degenerate semiconductor layer in the device of Comparative Example 2 was 2.3 eV. The specific resistance of the layer was $1 \times 10^5$ $\Omega$·cm.

A constant voltage of 6 V was applied to the device. The device driven at the constant voltage gave an initial luminance of 120 cd/m$^2$, but soon gave 10 cd/m$^2$. Its luminous efficiency was only 0.21 m/W, and its half lifetime was only 10 hours.

Comparing Comparative Examples 1 and 2 with Example 1, it is understood that the stability for hole conduction of the inorganic semiconductor is much higher than that of the organic compound. It is also understood that the inorganic non-degenerate semiconductor layer having a high level of band gap energy has electron barrier properties and has high stability for hole conduction.

COMPARATIVE EXAMPLE 3

Comparative Example 3 is described. The structure of the organic EL device of Comparative Example 3 is the same as that of the device of Example 1. In Comparative Example 3, however, the inorganic non-degenerate semiconductor layer was of InZnO. The carrier concentration in the InZnO layer is $10^{20}$ cm$^{-3}$. The specific resistance of the InZnO layer is $5 \times 10^{-4}$ $\Omega$·cm and is small.

A constant voltage of 6 V was applied to the device. The luminous efficiency of the device driven in that condition was only 0.251 m/W. It is believed that the reason why the device has such a low luminous efficiency will be because the carrier concentration in the inorganic non-degenerate semiconductor layer is high.

INDUSTRIAL APPLICABILITY

As described in detail hereinabove, the inorganic non-degenerate semiconductor layer in the organic EL device of the invention is formed of an amorphous material or a microcrystalline material. Therefore, in the device of the invention, the inorganic non-degenerate semiconductor layer is well planarized with no surface roughness that may produce a leak current. As a result, the luminous efficiency of the device is improved.

What is more, in the device of the invention, the band gap energy of the inorganic non-degenerate semiconductor layer is larger than that of the organic light-emitting layer. As a result, the excited state having been produced in the organic light-emitting layer is prevented from being inactivated through energy movement from the organic light-emitting layer to the inorganic non-degenerate semiconductor layer. Accordingly, the luminous efficiency of the device is improved.

What is claimed is:

1. An organic electroluminescent device having a structure of a first electrode layer which functions as an anode, an inorganic non-degenerate semiconductor layer, at least one organic layer including an organic light-emitting layer, and a second electrode layer which functions as a cathode as laminated in that order, wherein said inorganic non-degenerate semiconductor layer includes an amorphous material or a microcrystalline material, and its band gap energy is higher than the band gap energy of the organic light-emitting layer, wherein the band gap energy of said ignoring non-degenerate semiconductor layer fall between 2.7 eV and 6.0 eV, and wherein said inorganic non-degenerate semiconductor layer functions as a hole conduction layer.

2. The organic electroluminescent device as claimed in claim 1, wherein said inorganic non-degenerate semiconductor layer comprises, as the main component, an oxide or oxynitride of at least one element selected from the group consisting of Ba, Ca, Sr, Yb, Al, Ga, In, Li, Na, Cd, Mg, Si, Ta, Sb and Zn.

3. The organic electroluminescent device as claimed in claim 2, wherein:
said inorganic non-degenerate semiconductor layer is of an oxide or oxynitride of an element combination selected from the group consisting of:
In and Zn,
In, Zn and Al,
Al, Zn and Si,
In, Zn and Si,
In, Zn and Ti,
In, Zn and Sb,
In, Zn and Yb, and
In, Sn and Ta.

4. The organic electroluminescent device as claimed in claim 3, wherein the carrier concentration in said inorganic non-degenerate semiconductor layer falls between $10^{19}$ cm$^{-3}$ and $10^{12}$ cm$^{-3}$.

5. The organic electroluminescent device as claimed in claim 1, wherein the local level density in said inorganic non-degenerate semiconductor layer is smaller than $10^{17}$ cm$^{-3}$.

6. The organic electroluminescent device as claimed in claim 1, wherein said inorganic non-degenerate semiconductor layer is of an oxide of essentially In.

7. The organic electroluminescent device as claimed in claim 1, wherein the inorganic non-degenerate semiconductor layer exhibits no surface roughness as a result of planarization of the inorganic, non-degenerate semiconductor layer material.

* * * * *

UNITED STATES PATENT AND TRADEMARK OFFICE
CERTIFICATE OF CORRECTION

PATENT NO.    : 6,379,824 B1
DATED         : April 30, 2002
INVENTOR(S)   : Hosokawa It is certified that error appears in the above-identified patent and that said Letters Patent is hereby corrected as shown below:

<u>Title page,</u>
Item [22], the PCT filing date is incorrect. Item [22] should read:

-- [22]  PCT Filed:    Apr. 8, 1999 --

Signed and Sealed this

Eleventh Day of February, 2003

JAMES E. ROGAN
*Director of the United States Patent and Trademark Office*